United States Patent
Naritake

(10) Patent No.: US 6,601,197 B1
(45) Date of Patent: Jul. 29, 2003

(54) SEMICONDUCTOR MEMORY DEVICE

(75) Inventor: Isao Naritake, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/456,259

(22) Filed: Dec. 7, 1999

(30) Foreign Application Priority Data

Dec. 8, 1998 (JP) .......................................... 10-349203

(51) Int. Cl.[7] .............................................. G11C 29/00
(52) U.S. Cl. ...................................................... 714/718
(58) Field of Search ................................ 714/718, 726, 714/729, 32, 47, 48, 30, 719, 720, 723, 730, 731, 31, 49, 41, 43, 56, 715, 36, 65; 365/201; 710/65, 13, 14; 711/118; 712/229

(56) References Cited

U.S. PATENT DOCUMENTS

| | | | | |
|---|---|---|---|---|
| 4,575,792 A | * | 3/1986 | Keeley | ......................... 714/42 |
| 5,410,544 A | * | 4/1995 | Kreifels et al. | ......... 365/185.04 |
| 5,661,690 A | * | 8/1997 | Roohparvar | .............. 365/185.2 |
| 6,446,164 B1 | * | 9/2002 | Nguyen et al. | .............. 711/118 |

FOREIGN PATENT DOCUMENTS

| | | |
|---|---|---|
| JP | 01-276348 | 11/1989 |
| JP | 07-200404 | 8/1995 |

* cited by examiner

*Primary Examiner*—Albert Decady
*Assistant Examiner*—Matthew C. Dooley
(74) *Attorney, Agent, or Firm*—Katten Muchin Zavis Rosenman

(57) ABSTRACT

A semiconductor memory device is provided with an MPU, a secondary cache and a TAG memory mounted on a chip. Registers are provided for a plurality of test data buses connected parallel to a plurality of data buses from the MPU to the secondary cache or the TAG memory. The registers and the plurality of data buses of the MPU are changed with switches so as to be connected with a bonding pad which is a part of an external terminal for the MPU. With this arrangement, the semiconductor memory device can connect with a tester for a DRAM part test via the bonding pad.

12 Claims, 7 Drawing Sheets

SEMICONDUCTOR MEMORY DEVICE

BACKGROUND OF THE INVENTION

1. Field of the Invention

The present invention relates to a semiconductor memory device and more particularly to a semiconductor memory device having an MPU (Micro Processing Unit) and a DRAM (Dynamic Random Access Memory) as a secondary cache mounted on a chip wherein it is possible to prevent a data transmission delay during normal operation from increasing caused by a test writing for a DRAM part.

2. Description of the Related Art

As to a chip on which an MPU and DRAM as a secondary cache are mounted, when an evaluation test is tried for only the DRAM part, it is generally difficult to carry out the test for the DRAM part via the MPU, namely, using the function of the MPU.

Therefore, it is necessary to execute the test using a memory tester or the like after taking all data in the data buses between the MPU and the DRAM out to the outside via a test pad.

FIG. 7 is a block diagram explaining a conventional test procedure for a DRAM part in a chip on which an MPU and a DRAM as a secondary cache are mounted.

An MPU 101 and a DRAM part 102 are connected by data buses 104 via an output/input buffer (OUT/IN) 103. In this case, for example, when 138 buses are used for the secondary cache and 33 buses are used for a TAG memory storing with tags showing data stored in the secondary cache, the total of the data buses 104 is 171.

In order to make the test for the DRAM part possible, it is necessary to previously construct the chip in a manner that all of the data buses connected to the DRAM part are connected in parallel to a test bonding pad 106 via a test wiring 105 and are connected to a memory tester (not shown), and thereby a test is carried out.

However, in the chip on which the MPU and the secondary cache are mounted, as shown in FIG. 7, when all of the data buses between the MPU and the DRAM part are connected to the pad, large parasitic capacitance is added to the data buses between the MPU and the DRAM part caused by the test wiring or the like, there is a problem in that a delay of data transmission between the MPU and the DRAM increases.

Further, there is another problem in that areas shared for pads on the chip increase as the number of pads increases compared with a chip having only an MPU.

SUMMARY OF THE INVENTION

In view of the above difficulties, it is an object of the present invention to provide a semiconductor memory device having an MPU and a DRAM as a secondary cache on one chip wherein it is possible to prevent a data transmission delay in normal operation caused by a test wiring of the DRAM part from increasing and it is possible to reduce the number of test pads.

According to a first aspect of the present invention, there is provided a semiconductor memory device in which a processing unit and a memory as a secondary cache are mounted on a chip, the semiconductor memory device comprising:

a plurality of data buses connecting the processing unit and the memory as the secondary cache;

a plurality of test data buses, each of the test data buses connected in parallel to each of the plurality of data buses;

registers for holding data temporarily; and an external test terminal connected to the plurality of test data buses through the registers.

In the foregoing, a preferable mode is one wherein the external test terminal is a part of an external terminal for the processing unit.

Also, a preferable mode is one further comprising a switch for connecting the external test terminal with the registers or the plurality of data buses for the processing unit alternately.

Also, a preferable mode is one wherein a data transmission direction in the registers is changed depending on whether a test apparatus reads data from or writes data to the memory as the secondary cache.

According to a second aspect of the present invention, there is provided a semiconductor memory device in which a processing unit and a memory as a secondary cache are mounted on a chip; the semiconductor memory device comprising:

a plurality of data bus groups of data buses for connecting the processing unit and the memory as the secondary cache;

a plurality of test data bus groups of test data buses, each of the test data bus groups connected in parallel to each of the data bus groups;

selectors for selecting one test data bus group among the plurality of test data bus groups and respectively provided for the test data bus groups;

a multiplexer provided between a plurality of data buses in the selected test data bus group and an external test terminal and holding data of the plurality of data buses temporarily.

In the foregoing, a preferable mode is one wherein the external test terminal is a part of an external terminal of the processing unit.

Also, a preferable mode is one further comprising:

a switch for connecting the external test terminal with the multiplexer or the plurality of data buses for the processing unit alternately.

Also, a preferable mode is one wherein the selectors include a plurality of steps, and puts the plurality of test data bus groups together step by step so as to select one test data bus group.

Also, a preferable mode is one wherein a data transmission direction in the selectors is changed depending on whether a test apparatus reads data from or writes data to the memory as the secondary cache.

Also, a preferable mode is one wherein a data transmission direction in the multiplexer is changed depending on whether a test apparatus reads data from or writes data to the memory as the secondary cache.

According to the present invention, in the semiconductor memory device in which a processing unit and a memory as a secondary cache are mounted on a chip and are connected with a plurality of data buses, a plurality of test data buses connected in parallel to the plurality of data buses are connected to an external test terminal via registers for holding data temporarily, therefore, the capacitance added to the data buses between the processing unit and the secondary memory becomes small. As a result, it is possible to prevent the data transmission delay between the processing unit and the secondary memory in the normal operation from increasing. Also, it is possible to carry out the evaluation test for the memory as the secondary cache at a clock frequency equal to that of the actual operation.

Further, in this case, the external test terminal is a part of the external terminal for the processing unit, and is connected to the registers or the plurality of data buses alternately with the switches, therefore, it is impossible to prevent the number of terminals required for the unit test of the memory as the secondary cache from increasing.

Also, according to the present invention, in the semiconductor memory device in which a processing unit and a memory as a secondary cache are mounted on a chip and are connected with a plurality of data buses, the plurality of data buses between the processing unit and the secondary memory are divided into a plurality of groups, the selector selects one group among a plurality of groups of test data buses connected in parallel to the plurality of data bus groups, and the test external terminal is connected to the selected test data bus group via the multiplexer, therefore, the capacitance added to the data bus between the processing unit and the memory as the secondary cache becomes small. As a result, it is possible to prevent the data transmission delay between the processing unit and the secondary memory in the normal operation from increasing. Also, it is possible to carry out the evaluation test for only the memory as the secondary cache at a clock frequency equal to that of the normal operation. Moreover, it is possible to prevent the number of terminals required for the unit test of the secondary memory from increasing.

Further, in this case, the external test terminal is a part of the external terminal for the processing unit, and is connected to the multiplexer or the plurality of data buses alternately with the switches, therefore, it is possible to prevent the number of terminals required for the unit test of the memory as the secondary cache from increasing.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

In what follows, there will be described preferred embodiments of the present invention with reference to the accompanying drawings.

First Embodiment

Figure 1:
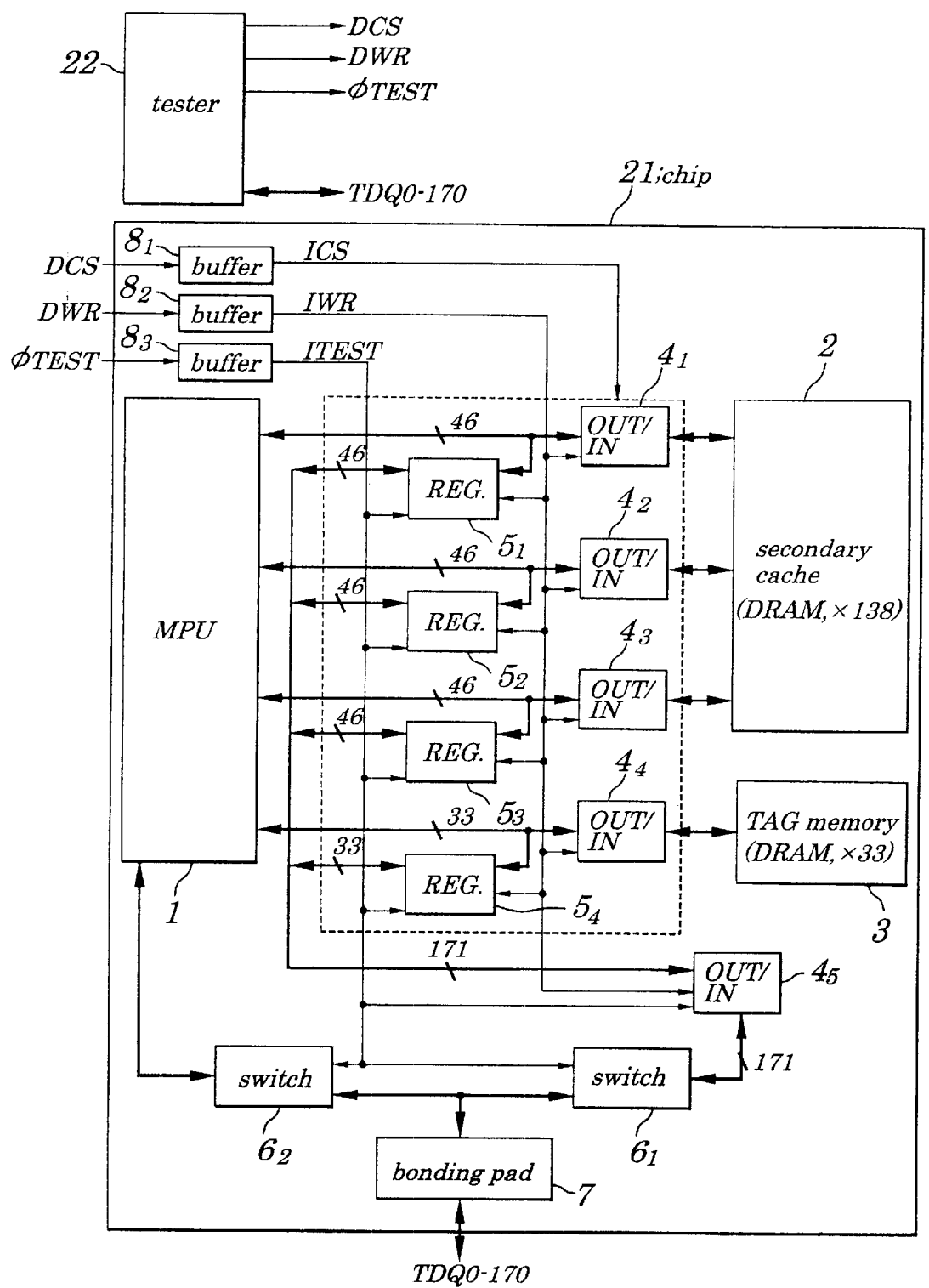
FIG. 1 is a block diagram showing an electrical structure of a semiconductor memory device according to a first embodiment of the present invention.
Figure 2A:
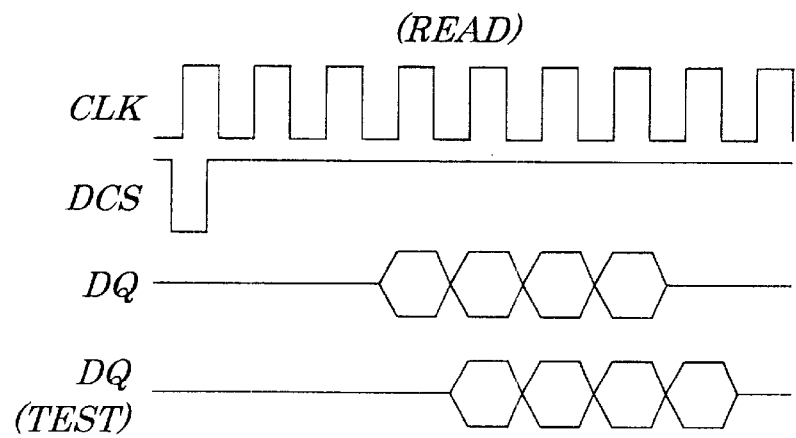
FIGS. 2A and 2B are timing charts explaining the operation of the semiconductor memory device according to the first embodiment.
Figure 2B:
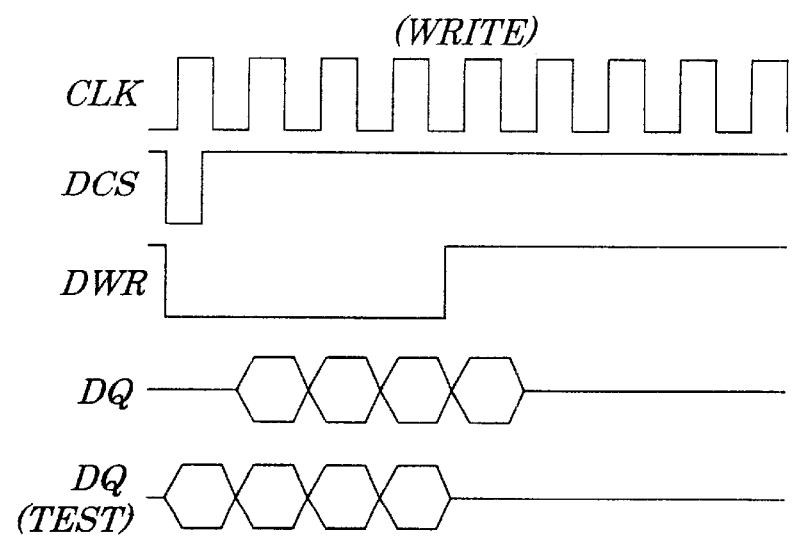
Figure 3:
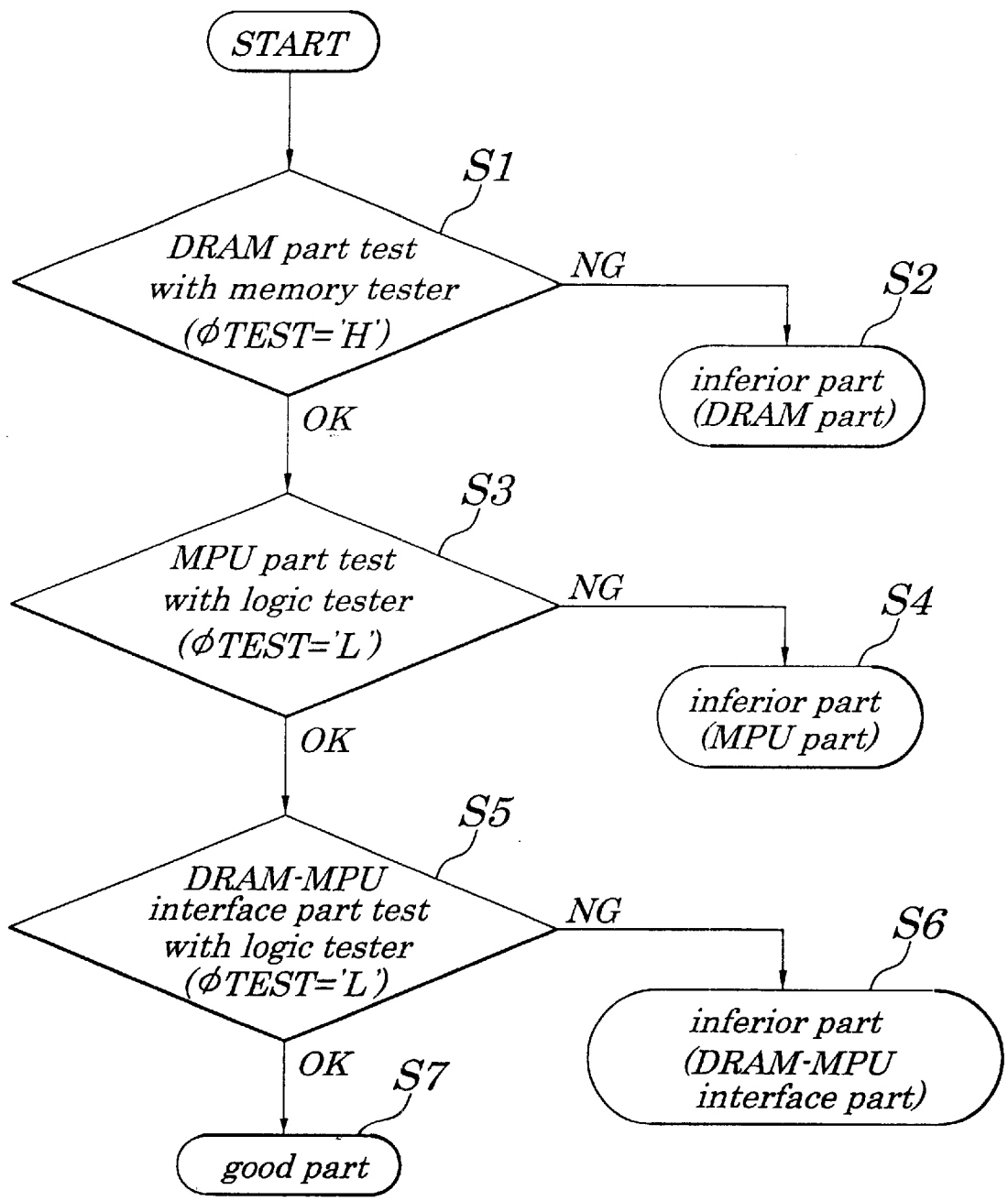
FIG. 3 is a flow chart showing a test procedure for the semiconductor memory device according to the first embodiment.
Figure 4:
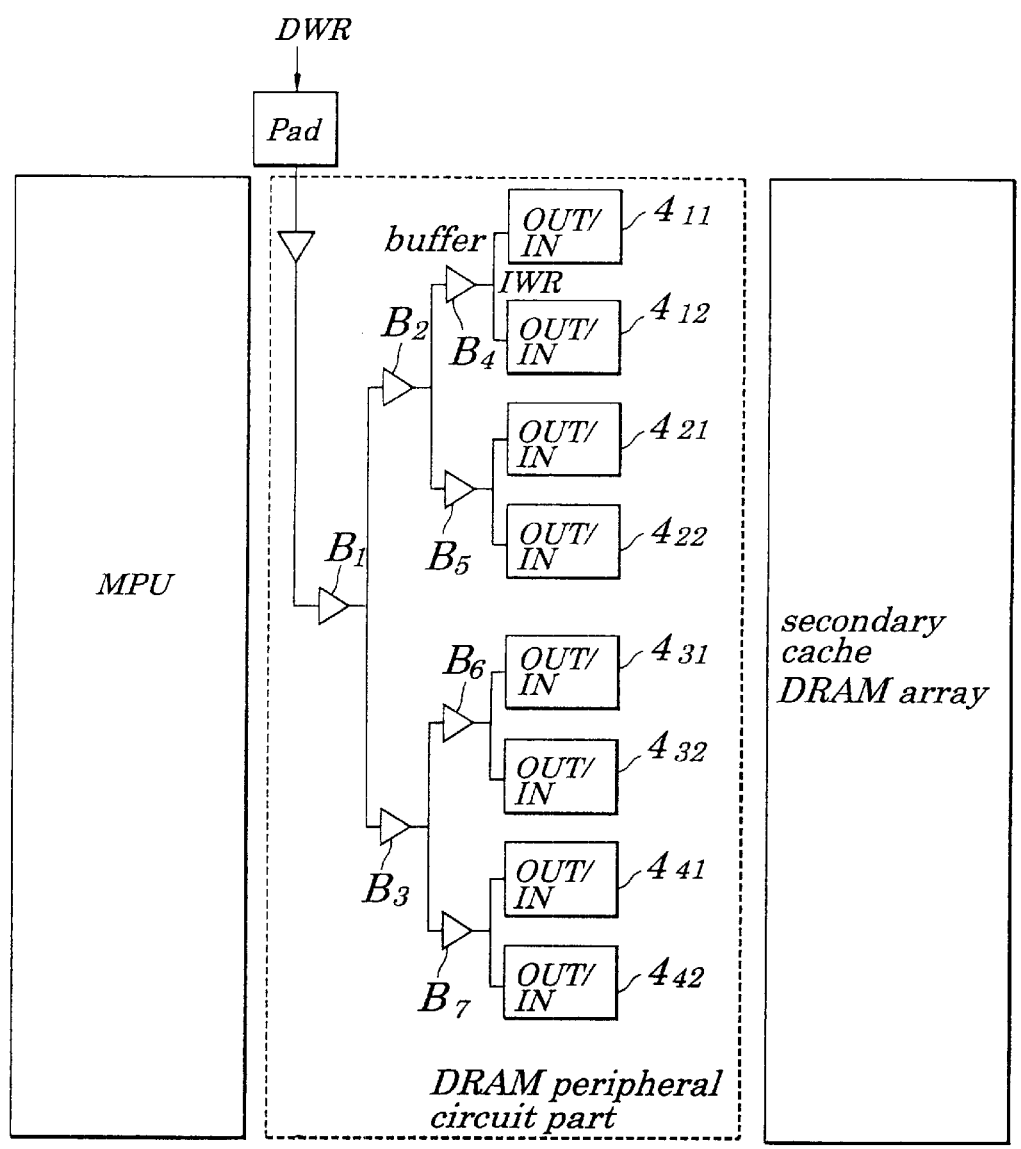
FIG. 4 is a block diagram showing a distribution procedure of a control signal in the semiconductor memory device according to the first embodiment.

FIG. 1 is a block diagram showing an electrical structure of a semiconductor memory device according to a first embodiment of the present invention, FIG. 2A and 2B are timing charts explaining the operation of the semiconductor memory device, FIG. 3 is a flow chart showing a test procedure for the semiconductor memory device, and FIG. 4 is a block diagram showing a distribution procedure of a control signal in the semiconductor memory device.

The semiconductor memory device according to the first embodiment, as shown in FIG. 1, is provided with an MPU 1, a secondary cache 2, a tag (TAG) memory 3, output/input buffers (OUT/INs) $4_1$, $4_2$, $4_3$, $4_4$, $4_5$, registers (REGs) $5_1$, $5_2$, $5_3$, $5_4$, switches $6_1$, $6_2$, a bonding pad 7, and buffers $8_1$, $8_2$, $8_3$. These are mounted on a chip 21. The numeral 22 indicates a tester.

The MPU 1 includes a primary cache, and is provided with three groups of data buses to the secondary cache 2, each of the groups including 46 buses, and 33 data buses to the TAG memory 3.

The secondary cache 2 supports a storage capacity (such as 64 KB) of the primary cache. The secondary cache 2 is provided with three secondary cache arrays of 46 bit-width, each of the arrays connected to the MPU 1 via the 46 data buses, namely, is provided with 138 DRAMs in total, and has the capacity of, for example, 512 KB through 16 MB.

The TAG memory 3 is stored with the respective tags of the data stored in the secondary cache 2, and is a DRAM consisting of an array of 33 bit-width connected to the MPU 1 via 33 data buses.

The OUT/INs $4_1$, $4_2$, $4_3$, change the respective data transmission directions of three groups of data buses, each of the groups including 46 data buses, in accordance with a control signal DWR between the MPU 1 and the secondary cache 2. The OUT/IN $4_4$ changes the data transmission directions of the 33 data buses between the MPU 1 and the TAG memory 3.

The REGs $5_1$, $5_2$, $5_3$ become in operating condition in accordance with a control signal øTEST, and temporarily hold write/read data of three groups of data buses, each the group including the 46 data buses between the MPU 1 and the secondary cache 2 in accordance with the control signal DWR. The REG $5_4$ becomes in operating condition in accordance with the control signal øTEST, and temporarily holds write/read data of the 33 data buses between the MPU 1 and the TAG memory 3 in accordance with the control signal DWR.

Further, test data buses are provided in parallel to the data uses, respectively, and are connected to the OUT/IN $4_5$. Each of the REGs $5_1$, $5_2$, $5_3$, is provided for the 46 test data buses and the REG $5_4$ is provided for the 33 test data buses.

The OUT/IN $4_5$ changes the data transmission directions of 171 data buses (test data buses) between the registers $5_1$, $5_2$, $5_3$, $5_4$ and the switch $6_1$.

The switch $6_1$ connects up or disconnects the 171 data buses (test data buses) between the OUT/IN $4_5$ and the bonding pad 7 in accordance with the control signal øTEST. The switch $6_2$ connects up or disconnects the 171 data buses between the MPU 1 and the bonding pad 7 in accordance with the control signal øTEST.

The bonding pad 7 is a part of an external connecting pad for the MPU 1, is used for external connection while the MPU 1 is operating or used for connection to the tester 22 while the secondary cache 2 is tested in accordance with selections by the switch $6_1$, $6_2$, and is connected to a data bus TDQ0-170.

The buffer $8_1$ supplies a control signal DCS making the secondary cache 2 operate to the OUT/INs $4_1, 4_2, 4_3, 4_4, 4_5$, the REGs $5_1, 5_2, 5_3, 5_4$ and the like as an internal control signal ICS.

The buffer $8_2$ supplies the control signal DWR controlling data reading/writing between the MPU 1 and the secondary cache 2 to the OUT/INs $4_1, 4_2, 4_3, 4_4, 4_5$, the REGs $5_1, 5_2, 5_3, 5_4$ and the like as an internal control signal IWR.

The buffer $8_3$ supplies the control signal øTEST making the chip 21 in test condition for the secondary cache 2 to the REGs $5_1, 5_2, 5_3, 5_4$, the OUT/IN $4_5$ and the switches $6_1, 6_2$ as an internal control signal ITEST.

The tester 22 outputs the control signals DCS, DWR and øTEST, is connected to the data bus TDQ0-170 for the unit test of the secondary cache 2 or the TAG memory 3, and executes a required test and so on.

Next, an explanation will be given of the operation of the semiconductor memory device according to the first embodiment with reference to FIGS. 1, 2A and 2B.

In the normal operation, the control signals DCS, DWR and øTEST are sent from the MPU 1 to the chip 21. At this time, the control signal øTEST is low, the REGs $5_1, 5_2, 5_3, 5_4$ are kept in non-operating condition, the switch $6_2$ becomes in connecting condition, and the 171 data buses of the MPU I are connected to required portions through the bonding pad 7.

When the MPU 1 reads data from the secondary cache 2, the control signal DWR is high and the OUT/INs $4_1, 4_2, 4_3, 4_4$ are in the condition to transfer data from the secondary cache 2 and the TAG memory 3 to the MPU 1. In this state, the control signal DCS is given, and thereby data reading from the secondary cache 2 and the TAG memory 3 starts. In this case, a time delay until data DQ is outputted into data buses between the MPU 1 and the secondary cache 2 or the TAG memory 3 is set to, for example, three clock pulses as shown in FIG. 2A.

When the MPU 1 writes data into the secondary cache 2 and the TAG memory 3, the control signal DWR is low and the OUT/INs $4_1, 4_2, 4_3, 4_4$ are in condition to transfer data from the MPU 1 to the secondary cache 2 and the TAG memory 3. In this state, the control signal DCS is given, and thereby data writing into the secondary cache 2 and the TAG memory 3 starts.

When the unit test for the secondary cache 2 or the TAG memory 3 is carried out, the control signals DCS, DWR and øTEST are sent from the tester 22 to the chip 21. The 171 data buses from the bonding pad 7 are connected to the tester 22. In this state, the control signal øTEST is high, the switch $6_2$ is in intercepting condition, the switch $6_1$, is in connecting condition, the data buses of the OUT/IN $4_5$ are connected to the tester 22 through the switch $6_1$ and the bonding pad 7, and the REGs $5_1, 5_2, 5_3, 5_4$ and the OUT/IN $4_5$ are in operating condition.

When data is read from the secondary cache 2 and the TAG memory 3, the control signal DWR is high, and the OUT/INs $4_1, 4_2, 4_3, 4_4$ are in the condition to transfer data from the secondary cache 2 and the TAG memory 3 to the REGs $5_1, 5_2, 5_3, 5_4$ via test data buses. In this state, the control signal DCS is given, and thereby data reading from the secondary cache 2 and the TAG memory 3 starts. A time delay until data DQ (TEST) is outputted into data buses between the secondary cache 2 or the TAG memory 3 and the tester 22 is set to, for example, four clock pulses as shown in FIG. 2A. This time delay is set by giving consideration to data transmission delays in the REGs $5_1, 5_2, 5_3, 5_4$, the OUT/IN $4_5$, the switch $6_1$ and so on.

When data is written into the secondary cache 2 and the TAG memory 3 from the tester 22, the control signal DWR is low, and the OUT/INs $4_1, 4_2, 4_3, 4_4$ are in the condition to transfer data from the tester 22 to the secondary cache 2 and the TAG memory 3. In this state, the control signal DCS is given, and thereby data writing into the secondary cache 2 and the TAG memory 3 starts. As shown in FIG. 2B, the timing to give the control signal DSC is set earlier than the timing of data writing with the MPU 1 for one clock pulse by giving consideration to data transmission delays in the REGs $5_1, 5_2, 5_3, 5_4$, the OUT/IN $4_5$, the switch $6_1$ and so on.

Next, an explanation will be given of the test procedure for the DRAM part in this semiconductor memory device with reference to FIG. 3.

First, the control signal øTEST is set to high, and the test for the DRAM part is carried out by a memory tester included in the tester 22 (Step S1).

The control signal DWR is set to low, the X addresses and the Y addresses in the secondary cache 2 and the TAG memory 3 are sequentially changed, and thereby L (low) data is written in all of memory cells. At this time, when the X addresses are changed (when word lines are switched), the control signal DCS is generated at the timing as shown in FIG. 2B.

Then, the control signal DWR is set to high, the X addresses and the Y addresses in the secondary cache 2 and the TAG memory 3 are sequentially changed, and thereby data is read from all of the memory cells and the read data is evaluated with the memory tester. In this case, when the X addresses are changed, the control signal DCS is generated at the timing as shown in FIG. 2A.

In this case, all the data read from the secondary cache 2 and the TAG memory 3 may be L data in normal condition. When H (high) data is read, it is determined that the DRAM part consisting of the secondary cache 2 and the TAG memory 3 is inferior (Step S2).

Then, the control signal is set to low, the X addresses and the Y addresses in the secondary cache 2 and the TAG memory 3 are sequentially changed, and thereby H data is written in all of memory cells. At this time, when the X addresses are changed (when word lines are switched), the control signal DCS is generated at the timing as shown in FIG. 2B.

Then, the control signal DWR is set to high, the X addresses and the Y addresses in the secondary cache 2 and the TAG memory 3 are sequentially changed, and thereby data is read from all of the memory cells and the read data is evaluated with the memory tester. In this case, when the X addresses are changed, the control signal DCS is generated at the timing as shown in FIG. 2A.

In this case, all the data read from the secondary cache 2 and the TAG memory 3 may be H data in normal condition. When L data is read, it is determined that the DRAM part consisting of the secondary cache 2 and the TAG memory 3 is inferior (Step S2).

In the above-mentioned test procedure, first, L data is written in all of memory cells, secondly, L data is read from all of memory cells, thirdly, the evaluation is executed with the memory tester, fourthly, H data is written into all of the memory cells, fifthly, H data is read from all of the memory cells, sixthly, the evaluation is executed with the memory tester. This procedure is called a scan W/R test pattern. There are various test patterns other than this test pattern. For example, a procedure may be used in which an evaluation is carried out by writing/reading data for one bit while the X address and the Y address are sequentially changed (namely, a one-bit W/R test pattern).

Then, the control signal øTEST is set to low, and the MPU part is tested with a logic tester included in the tester 22 (Step S3). When a preferable result is not obtained, it is determined that the MPU part is inferior (Step S4).

Then, the control signal øTEST is set to low, and the DRAM-MPU interface part is tested with the logic tester included in the tester 22 (Step S5). When a preferable result is not obtained, it is determined that the DRAM-MPU interface part is inferior (Step S6).

Though the DRAM part determined as inferior is normally used with a redundancy circuit to a certain extent, it is discarded when exceeding the limit.

Next, an explanation will be given of a distribution procedure for the control signals DCS, DWR with reference to FIG. 4.

In FIG. 4, the OUT/INs $4_1$, $4_2$, $4_3$, $4_4$ shown in FIG. 1 are divided into the OUT/INs ($4_{11}$, $4_{12}$), ($4_{21}$, $4_{22}$), ($4_{31}$, $4_{32}$), ($4_{41}$, $4_{42}$) for 23 buses. Buffers $B_1$, $B_2$, $B_3$, $B_4$, $B_5$, $B_6$ are provided in a tree-structure in order to distribute the control signal DWR to each of the OUT/INs.

With this structure, it is possible to distribute the control signal DWR to each of the OUT/INs with an equivalent transmission delay time, therefore, an access can be carried out at high speed. Also, the control signal DCS is distributed similarly. Incidentally, the case is similar in which each of the OUT/INs is not divided as shown in FIG. 1.

As described above, in the semiconductor memory device according to the first embodiment, registers are provided for the test data buses connected in parallel to the data buses between the MPU and the DRAM as the secondary cache, therefore, the capacitance added to the data bus between the MPU and the DRAM as the secondary cache becomes small. As a result, it is possible to prevent the data transmission delay between the MPU and the DRAM as the secondary cache in the normal operation from increasing. Also, in the test for the DRAM part, delays for writing/reading are changed compared with the normal operation, and thereby it is possible to carry out an evaluation test at high speed equally to the normal operation.

Further, the test pad and a part of the pad for MPU are used in common, therefore, it is possible to prevent the number of pads required for the unit test of the DRAM part from increasing.

Second Embodiment

Figure 5:
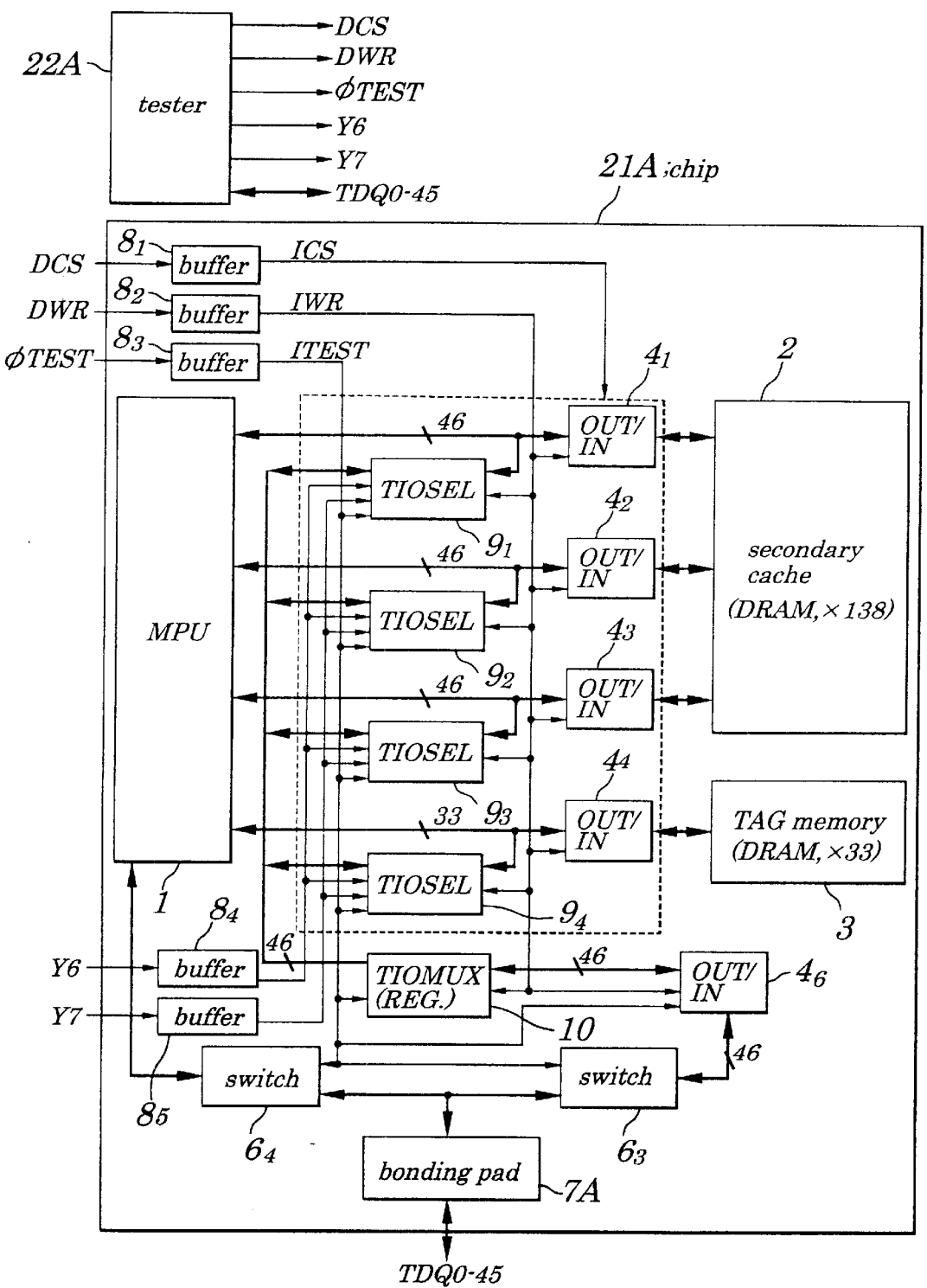
FIG. 5 is a block diagram showing an electrical structure of a semiconductor memory device according to a second embodiment of the present invention.

FIG. 5 is a block diagram showing a structure of a semiconductor memory device according to the second embodiment of the present invention.

The semiconductor memory device according to the second embodiment, as shown in FIG. 5, is provided with an MPU 1, a secondary cache 2, a tag (TAG) memory 3, output/input buffers (OUT/INs) $4_1$, $4_2$, $4_3$, $4_4$, $4_6$, switches $6_3$, $6_4$, a bonding pad 7A, and buffers $8_1$, $8_2$, $8_3$, $8_4$, $8_5$, selectors (TIOSELs) $9_1$, $9_2$, $9_3$, $9_4$ and a multiplexer (TIOMUX) 10. These are mounted on a chip 21A. The numeral 22A indicates a tester.

In the second embodiment, the MPU 1, the secondary cache 2, the TAG memory 3, the OUT/INs $4_1$, $4_2$, $4_3$, $4_4$, and the buffers $8_1$, $8_2$, $8_3$ are similar to those of the first embodiment shown in FIG. 1.

As to the TIOSELs $9_1$, $9_2$, $9_3$, $9_4$, when the control signal øTEST is given to them through the buffers $8_3$, one of them becomes in operating condition in accordance with the addresses 6Y, 7Y, selects one group among three groups of data buses, each the group including 46 data buses, between the MPU 1 and the secondary cache 2 and a group of 33 data buses between the MPU 1 and the TAG memory 3 so as to connect with the TIOMUX 10. Also, the data transmission direction is changed in accordance with the control signal DWR.

The TIOMUX 10 is a register. The TIOMUX 10 becomes in operating condition in accordance with the control signal øTEST, and holds read/write data for the secondary cache 2 and the TAG memory 3 between the data buses selected by the TIOSELs $9_1$, $9_2$, $9_3$, $9_4$ and the OUT/IN $4_6$ in accordance with the control signal DWR.

The OUT/IN $4_6$ becomes in operating condition in accordance with the control signal øTEST, and changes the data transmission direction of the data bus between the TIOMUX 10 and the switch $6_3$ in accordance with the control signal DWR.

The switch $6_3$ connects or disconnects data buses between the OUT/IN $4_6$ and the bonding pad 7A in accordance with the control signal øTEST. The switch $6_4$ connects or disconnects data buses between the MPU 1 and the bonding pad 7A in accordance with the control signal øTEST.

The bonding pad 7A is a part of an external connecting pad for the MPU 1, is used for data input/output while the MPU 1 is operating or used for connection to the tester 22A while the secondary cache 2 is tested in accordance with selections by the switch $6_3$, $6_4$, and is connected to a data bus TDQ0-45.

The buffer $8_4$, $8_5$, supply the TIOSELs $9_1$, $9_2$, $9_3$, $9_4$ with the addresses Y6, Y7 selecting one among three secondary cache arrays constituting the secondary cache 2 and the TAG memory 3.

The tester 22 outputs the control signals DCS, DWR and øTEST and the addresses Y6, Y7, is connected to the data bus TDQ0-45 for the unit test of the secondary cache 2 or the TAG memory 3, and executes a required test and so on.

Next, an explanation will be given of the operation of the semiconductor memory device according to the second embodiment with reference to FIG. 5.

The second embodiment differs widely from the first embodiment shown in FIG. 1 in that the TIOSELs $9_1$, $9_2$, $9_3$, $9_4$ are provided instead of the REGs $5_1$, $5_2$, $5_3$, $5_4$, one of them is selected in accordance with the addresses Y6, Y7, and thereby the DRAM part is connected to the tester 22A via the TIOMUX 10 for the divided data buses so as to be tested.

In the normal operation, the control signals DCS, DWR and øTEST are sent from the MPU 1 to the chip 21A. At this time, the control signal øTEST is low, the TIOSELs $9_1$, $9_2$, $9_3$, $9_4$ and the TIOMUX 10 are kept in a non-operating condition, the switch $6_4$ is in connecting condition, and 46 data buses of the MPU 1 are connected to required portions through the bonding pad 7A.

In this state, the MPU 1 reads/writes data from/to the secondary cache 2 and the TAG memory 3 similarly to the first embodiment shown in FIG. 1 in accordance with the timing chart shown in FIGS. 2A and 2B except that data transmission for the 46 data buses is carried out via the bonding pad 7A.

When the unit test is carried out for the secondary cache 2 or the TAG memory 3, the control signals DCS, DWR and øTEST are sent from the tester 22A to the chip 21A. The 46 data buses from the bonding pad 7A are connected to the tester 22A. In this state, the control signal øTEST is high, the switch $6_4$ is in intercepting condition, the switch $6_3$ is in connecting condition, the data bus of the OUT/IN $4_6$ is connected to the tester 22A through the switch $6_3$ and the bonding pad 7A, and the TIOSELs $9_1$, $9_2$, $9_3$, $9_4$, the TIOMUX 10 and the OUT/IN $4_6$ are in operating condition.

When data is read from the secondary cache 2 and the TAG memory 3, the control signal DWR is high, and the OUT/INs $4_1$, $4_2$, $4_3$, $4_4$ are in condition to transfer data from the secondary cache 2 and the TAG memory 3 to the TIOSELs $9_1$, $9_2$, $9_3$, $9_4$. In this state, the control signal DCS is given, and thereby data reading from the secondary cache 2 and the TAG memory 3 starts. A time delay until data DQ (TEST) is outputted into data buses between the secondary cache 2 or the TAG memory 3 and the tester 22A is set to, for example, four clock pulses as shown in FIG. 2A. This time delay is set by giving consideration to data transmission delays in the TIOSELs $9_1$, $9_2$, $9_3$, $9_4$, the TIOMUX 10, the OUT/IN $4_6$, the switch $6_3$ and so on.

When data is written into the secondary cache 2 and the TAG memory 3 from the tester 22A, the control signal DWR is low, and the OUT/INs $4_1$, $4_2$, $4_3$, $4_4$ are in condition to transfer data from the tester 22A to the secondary cache 2 and the TAG memory 3. In this state, the control signal DCS is given, and thereby data writing into the secondary cache 2 and the TAG memory 3 starts. As shown in FIG. 2B, the timing to give the control signal DSC is set earlier than the timing of data writing with the MPU 1 for one clock pulse by giving consideration to data transmission delays in the TIOSELs $9_1$, $9_2$, $9_3$, $9_4$, the OUT/IN $4_6$, the switch $6_3$ and so on.

Next, an explanation will be given of the test procedure for the DRAM part in this semiconductor memory device with reference to FIG. 3.

First, the control signal øTEST is set to high and the addresses (Y6, Y7) are set to (0, 0), and then the test for the DRAM part of the first 46 data buses is carried out by a memory tester included in the tester 22A (Step S1).

The control signal DWR is set to low, the X addresses and the Y addresses except Y6, Y7 in the secondary cache 2 and the TAG memory 3 are sequentially changed, and thereby L is written in all of memory cells. At this time, when the X addresses are changed (when word lines are switched), the control signal DCS is generated at the timing as shown in FIG. 2B.

Then, the control signal DWR is set to high, the X addresses and the Y addresses except Y6, Y7 in the secondary cache 2 and the TAG memory 3 are sequentially changed, and thereby data is read from all of the memory cells and the read data is evaluated with the memory tester. In this case, when the X addresses are changed, the control signal DCS is generated at the timing as shown in FIG. 2A.

In this case, all the data read from the secondary cache 2 and the TAG memory 3 may be L data in normal condition. When H data is read, it is determined that the DRAM part consisting of the secondary cache 2 and the TAG memory 3 is inferior (Step S2).

Then, the control signal is set to low, the X addresses and the Y addresses except Y6, Y7 in the secondary cache 2 and the TAG memory 3 are sequentially changed, and thereby H data is written in all of memory cells. At this time, when the X addresses are changed (when word lines are switched), the control signal DCS is generated at the timing as shown in FIG. 2B.

Then, the control signal DWR is set to high, the X addresses and the Y addresses except Y6, Y7 in the secondary cache 2 and the TAG memory 3 are sequentially changed, and thereby data is read from all of the memory cells and the read data is evaluated with the memory tester. In this case, when the X addresses are changed, the control signal DCS is generated at the timing as shown in FIG. 2A.

In this case, all the data read from the secondary cache 2 and the TAG memory 3 may be H data in normal condition. When L data is read, it is determined that the DRAM part consisting of the secondary cache 2 and the TAG memory 3 is inferior (Step S2).

Then, the control signal øTEST is set to high and the addresses (Y6, Y7) are set to (0, 1), and then the test for DRAM part of the following 46 data buses is carried out by the memory tester included in the tester 22A (Step S1).

Then, the control signal øTEST is set to high and the addresses (Y6, Y7) are set to (1, 0), and then the test for the DRAM part of the further following 46 data buses is carried out by the memory tester included in the tester 22A (Step S1).

Finally, the control signal øTEST is set to high and the addresses (Y6, Y7) are set to (1, 1), and then the test for the TAG memory 3 of the following 33 data buses is carried out by the memory tester included in the tester 22A (Step S1).

With the above-mentioned procedure, the evaluation for L data/H data writing/reading in/from all of memory cells with the tester is finished. Incidentally, the evaluation using the one-bit W/R pattern may be applied similarly to the first embodiment.

Also, the tests for the MPU part and the DRAM-MPU interface part can be carried out with the logic tester included in the tester 22A similarly to the first embodiment.

Further, the tree-distribution procedure for the control signals DCS, DWR shown in FIG. 4 may be applied to the second embodiment.

As described above, in the semiconductor memory device according to the second embodiment, selectors are provided for the test data buses connected in parallel to the data buses between the MPU and the DRAM as the secondary cache, therefore, the capacitance added to the data bus between the MPU and the DRAM as the secondary cache becomes small. As a result, it is possible to prevent the data transmission delay between the MPU and the DRAM as the secondary cache in the normal operation from increasing. Also, in the unit test of the DRAM part, delays for writing/reading are changed compared with the normal operation, and thereby it is possible to carry out an evaluation test at high speed equally to the normal operation.

Further, the DRAM part is divided into any number of blocks, the test is carried out for each divided DRAM block, and then the test pads for data buses corresponding to the divided DRAM block and a part of the pad for the MPU are used in common, therefore, it is possible to reduce the number of pads required for an unit test of the DRAM part.

Third Embodiment

Figure 6:
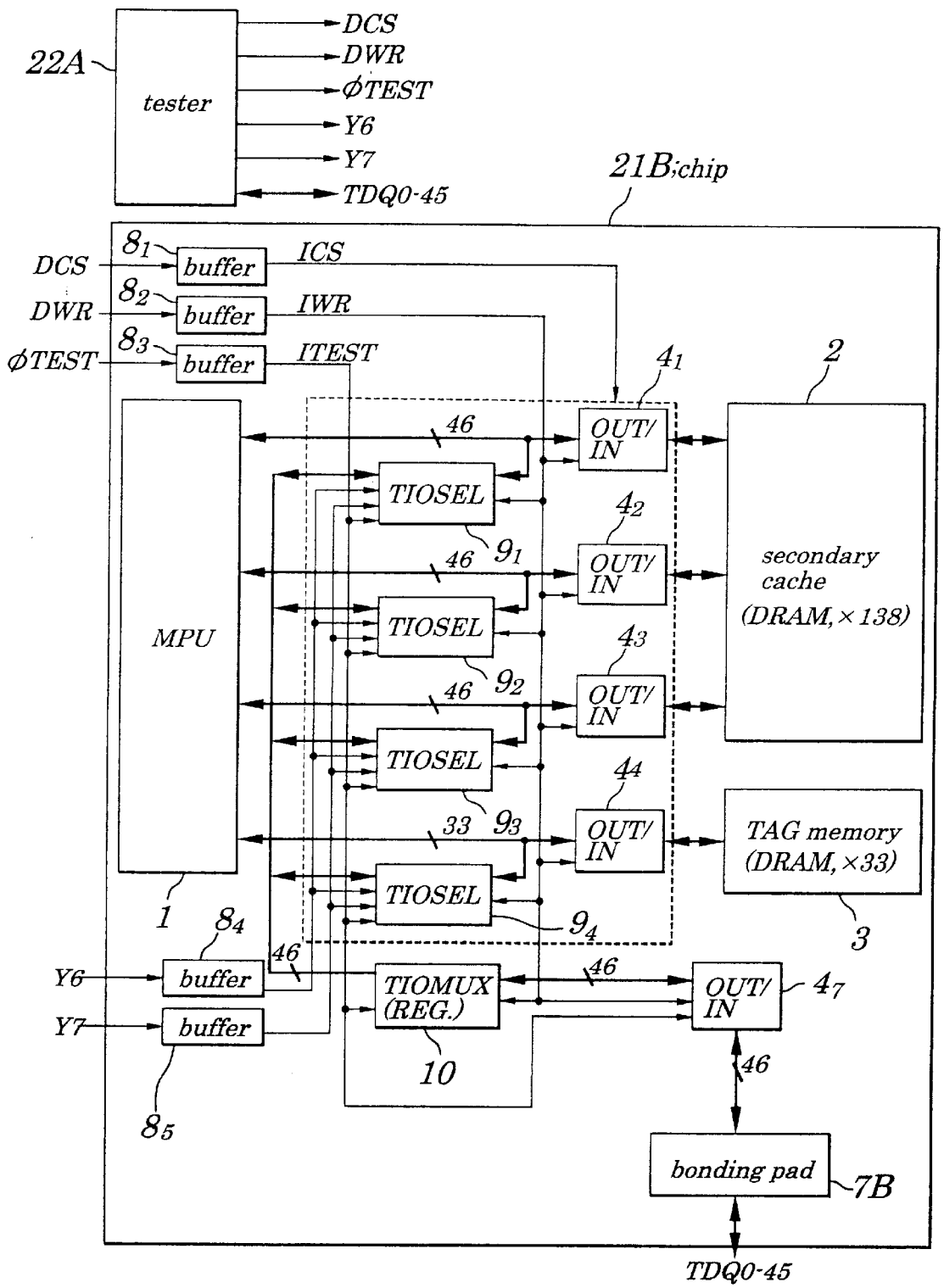
FIG. 6 is a block diagram showing an electrical structure of a semiconductor memory device according to a third embodiment of the present invention.
Figure 7:
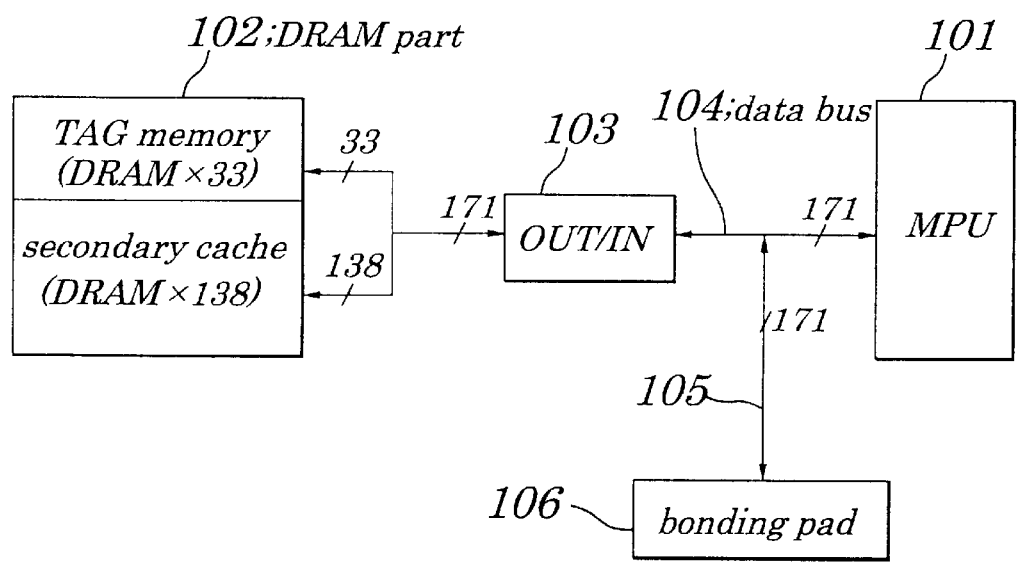
FIG. 7 is a block diagram explaining a conventional test procedure for the DRAM part in a chip on which an MPU and a DRAM as a secondary cache are mounted.

FIG. 6 is a block diagram showing a structure of a semiconductor memory device according to the third embodiment of the present invention.

The semiconductor memory device according to the third embodiment, as shown in FIG. 6, is provided with an MPU 1, a secondary cache 2, a tag (TAG) memory 3, output/input buffers (OUT/INs) $4_1$, $4_2$, $4_3$, $4_4$, $4_7$, a bonding pad 7B, and buffers $8_1$, $8_2$, $8_3$, $8_4$, $8_5$, selectors (TIOSELs) $9_1$, $9_2$, $9_3$, $9_4$ and a multiplexer (TIOMUX) 10. These are mounted on a chip 21B. The numeral 22A indicates a tester.

In the third embodiment, the MPU 1, the secondary cache 2, the TAG memory 3, the OUT/INs $4_1$, $4_2$, $4_3$, $4_4$, the buffers $8_1$, $8_2$, $8_3$, the TIOSELs $9_1$, $9_2$, $9_3$, $9_4$ and the TIOMUX 10 are similar to those of the second embodiment shown in FIG. 5.

The OUT/IN $4_7$ becomes in operating condition in accordance with the control signal øTEST, and changes the data transmission direction of the data bus between the TIOMUX 10 and the bonding pad 7B in accordance with the control signal DWR.

The bonding pad 7B is not shared with an external connecting pad for the MPU, and is provided independently.

Next, an explanation will be given of the operation of the semiconductor memory device according to the third embodiment with reference to FIG. 6.

The third embodiment differs widely from the second embodiment shown in FIG. 5 in that no switches $6_3$, $6_4$ are provided, the OUT/IN $4_7$ is directly connected to the tester 22A via the bonding pad 7B for test use only, and then the DRAM part is tested.

In the normal operation, the control signals DCS, DWR and øTEST are sent from the MPU 1 to the chip 21B. At this time, the control signal øTEST is low, the TIOSELs $9_1$, $9_2$, $9_3$, $9_4$ and the TIOMUX 10 are kept in non-operating condition, the switch $6_4$ is in connecting condition.

In this state, the MPU 1 reads/writes data from/to the secondary cache 2 and the TAG memory 3 independently of test circuit parts in accordance with the timing charts shown in FIGS. 2A and 2B.

When the unit test is carried out for the secondary cache 2 or the TAG memory 3, the control signals DCS, DWR and øTEST are sent from the tester 22A to the chip 21B. The 46 data buses from the bonding pad 7B are connected to the tester 22A. In this state, the control signal øTEST is high, the data bus of the OUT/IN $4_6$ is connected to the tester 22B through the bonding pad 7B, and the TIOSELs $9_1$, $9_2$, $9_3$, $9_4$, the TIOMUX 10 and the OUT/IN $4_7$ become in operating condition.

When data is read from the secondary cache 2 and the TAG memory 3, the control signal DWR is high, and the OUT/INs $4_1$, $4_2$, $4_3$, $4_4$ are in condition to transfer data from the secondary cache 2 and the TAG memory 3 to the TIOSELs $9_1$, $9_2$, $9_3$, $9_4$. In this state, the control signal DCS is given, and thereby data reading from the secondary cache 2 and the TAG memory 3 starts. A time delay until data DQ (TEST) is outputted into data buses from the secondary cache 2 or the TAG memory 3 to the tester 22B is set to, for example, four clock pulses as shown in FIG. 2A. This time delay is set by giving consideration to data transmission delays in the TIOSELs $9_1$, $9_2$, $9_3$, $9_4$, the TIOMUX 10, the OUT/IN $4_7$ and so on.

When data is written into the secondary cache 2 and the TAG memory 3 from the tester 22A, the control signal DWR is low, and the OUT/INs $4_1$, $4_2$, $4_3$, $4_4$ are in condition to transfer data from the tester 22A to the secondary cache 2 and the TAG memory 3. In this state, the control signal DCS is given, and thereby data writing into the secondary cache 2 and the TAG memory 3 starts. As shown in FIG. 2B, the timing to give the control signal DSC is set earlier for one clock pulse than the timing of data writing with the MPU 1 by giving consideration to data transmission delays in the TIOSELs $9_1$, $9_2$, $9_3$, $9_4$, the OUT/IN $4_7$, and so on.

The test procedure for the DRAM part in this semiconductor memory device can be carried out in accordance with the flow chart shown in FIG. 3 similarly to the second embodiment.

With this procedure, it is possible to carry out the evaluation for L data/H data writing/reading L in/from all of memory cells with the tester. Incidentally, the evaluation using the one-bit W/R pattern may be applied similarly to the second embodiment.

Also, the tests for the MPU part and the DRAM-MPU interface part are carried out with the logic tester included in the tester 22A similarly to the second embodiment.

Further, the tree-distribution procedure for the control signals DCS, DWR shown in FIG. 4 may be applied to the third embodiment.

As described above, in the semiconductor memory device according to the second embodiment, selectors are provided for the test data buses connected in parallel to the data buses between the MPU and the DRAM as the secondary cache, therefore, the capacitance added to the data bus between the MPU and the DRAM as the secondary cache becomes small. As a result, it is possible to prevent the data transmission delay between the MPU and the DRAM as the secondary cache in the normal operation from increasing. Also, in the unit test of the DRAM part, delays for writing/reading are changed compared with the normal operation, and thereby it is possible to carry out an evaluation test at high speed equally to the normal operation.

Further, the DRAM part is divided into any number of blocks, the test is carried out for each the divided DRAM block, and then the test pads for data buses corresponding to the divided DRAM block and a part of the pad for the MPU are used in common, therefore, it is possible to reduce the number of pads required for an unit test of the DRAM part.

As described above, the detailed explanations are given of the embodiments according to the present invention with reference to drawings. However, a concrete structure is not limited to these embodiments, and the present invention includes any variation and any modification in design or the like within the scope of the present invention.

For example, in the first embodiment, the bonding pad 7 may be used for only test, not shared with the external connecting pad of the MPU 1. Also, when there are many selectors (TIOSELs), these selectors may be structured in a plurality of steps, groups of data buses may be put together step by step and one divided group of data buses may be selected.

As explained above, according to the present invention, in the semiconductor memory device in which the MPU and the secondary DRAM are mounted on a chip, registers or selectors are provided for the test data buses connected parallel to the data buses between the MPU and the DRAM as the secondary cache, therefore, the capacitance added to the data bus between the MPU and the DRAM as the secondary cache becomes small. As a result, it is possible to prevent the data transmission delay between the MPU and the DRAM as the secondary cache in the normal operation from increasing. Further, it is unnecessary to change a delay time and so on. Also, in the unit test of the DRAM part, delays for writing/reading are changed compared with the normal operation, and thereby it is possible to carry out an evaluation test at high speed equally to the normal operation.

Further, the test pads and a part of the pad for the MPU are used in common, therefore, it is possible to reduce the number of pads required for an unit test of the DRAM part. Also, the DRAM part is divided into any number of blocks, the test is carried out for each the divided DRAM block, and thereby it is possible to reduce the number of pads moreover.

It is thus apparent that the present invention is not limited to the above embodiments but may be changed and modified without departing from the scope and spirit of the invention.

Finally, the present application claims the priority based on Japanese Patent Application No. Hei10-349203 filed on Dec. 8, 1998, which is herein incorporated by reference.

What is claimed is:

1. A semiconductor memory device in which a processing unit and memory means as a secondary cache are mounted on a chip, said semiconductor memory device comprising:
    a plurality of data buses connecting said processing unit and said memory means as said secondary cache;
    a plurality of test data buses, each of said test data buses being connected in parallel to each of said plurality of data buses;
    a plurality of register means for holding data temporarily; and
    an external test terminal connected to said plurality of test data buses through respective ones of said plurality of register means.

2. The semiconductor memory device according to claim 1, wherein said test external terminal is a part of an external terminal for said processing unit.

3. The semiconductor memory device according to claim 1, wherein a data transmission direction in said register means is changed depending on whether a test apparatus reads data from or writes data to said memory means as said secondary cache.

4. A semiconductor memory device in which a processing unit and memory means as a secondary cache are mounted on a chip, said semiconductor memory device comprising:
    a plurality of data buses connecting said processing unit and said memory means as said secondary cache;
    a plurality of test data buses, each of said test data buses connected in parallel to each of said plurality of data buses;
    register means for holding data temporarily;
    an external test terminal connected to said plurality of test data buses through said register means;
    switch means for connecting said external test terminal with said register means or said plurality of data buses for said processing unit alternately.

5. The semiconductor memory device according to claim 4, wherein said test external terminal is a part of an external terminal for said processing unit.

6. The semiconductor memory device according to claim 4, wherein a data transmission direction in said register means is changed depending on whether a test apparatus reads data from or writes data to said memory means as said secondary cache.

7. A semiconductor memory device in which a processing unit and memory means as a secondary cache are mounted on a chip; said semiconductor memory device comprising:
    a plurality of data bus groups of data buses for connecting said processing unit and said memory means as said secondary cache;
    a plurality of test data bus groups of test data buses, each of said test data bus groups being connected in parallel to each of said data bus groups;
    a plurality of selector means for selecting one test data bus group among said plurality of test data bus groups and respectively provided for said test data bus groups; and
    multiplexer means provided between a plurality of data buses in said selected test data bus group and an external test terminal for temporarily holding data of said plurality of data buses.

8. The semiconductor memory device according to claim 7, wherein said external test terminal is a part of an external terminal of said processing unit.

9. The semiconductor memory device according to claim 7, further comprising:
    switch means for connecting said external test terminal with said multiplexer means or said plurality of data buses of said processing unit alternately.

10. The semiconductor memory device according to claim 7, wherein said selector means includes a plurality of steps, and puts said plurality of test data bus groups together step by step so as to select one test data bus group.

11. The semiconductor memory device according to claim 7, wherein a data transmission direction in said selector means is changed depending on whether a test apparatus reads data from or writes data to said memory means as said secondary cache.

12. The semiconductor memory device according to claim 7, wherein a data transmission direction in said multiplexer means is changed depending on whether a test apparatus reads data from or writes data to said memory means as said secondary cache.

* * * * *